United States Patent
Bytheway

(10) Patent No.: US 8,581,881 B2
(45) Date of Patent: *Nov. 12, 2013

(54) DRIVEN SHIELD FOR CAPACITIVE TOUCHPADS

(75) Inventor: Jared G. Bytheway, Sandy, UT (US)

(73) Assignee: Cirque Corporation, Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/585,443

(22) Filed: Aug. 14, 2012

(65) Prior Publication Data

US 2012/0327022 A1      Dec. 27, 2012

Related U.S. Application Data

(63) Continuation of application No. 12/059,810, filed on Mar. 31, 2008, now Pat. No. 8,243,043.

(60) Provisional application No. 60/908,853, filed on Mar. 29, 2007.

(51) Int. Cl.
*G01R 27/26*     (2006.01)

(52) U.S. Cl.
USPC ........... 345/174; 324/658; 324/662; 324/686; 324/688

(58) Field of Classification Search
USPC ................... 345/157–174; 178/18.01–18.06; 324/658–662, 688, 686; 73/718, 724; 341/33
See application file for complete search history.

(56) References Cited

U.S. PATENT DOCUMENTS

| | | | |
|---|---|---|---|
| 4,237,421 A | 12/1980 | Waldron | |
| 5,637,802 A | 6/1997 | Frick et al. | |
| 6,069,970 A | 5/2000 | Salatino et al. | |
| 6,082,199 A | 7/2000 | Frick et al. | |
| 6,089,097 A | 7/2000 | Frick et al. | |
| 6,484,585 B1 | 11/2002 | Sittler et al. | |
| 7,218,124 B1 | 5/2007 | Mackey et al. | |
| 7,382,139 B2 | 6/2008 | Mackey et al. | |
| 7,548,073 B2 | 6/2009 | Mackey et al. | |
| 7,583,092 B2 | 9/2009 | Reynolds et al. | |
| 7,692,431 B2 | 4/2010 | Mackey | |
| 8,243,043 B2 * | 8/2012 | Bytheway ..................... | 345/174 |
| 2002/0000977 A1 | 1/2002 | Vranish | |
| 2006/0038791 A1 | 2/2006 | Mackey et al. | |
| 2006/0187214 A1 | 8/2006 | Gillespie et al. | |
| 2006/0274055 A1 | 12/2006 | Reynolds et al. | |
| 2007/0109274 A1 | 5/2007 | Reynolds et al. | |
| 2007/0159184 A1 | 7/2007 | Reynolds et al. | |
| 2007/0176608 A1 | 8/2007 | Mackey et al. | |
| 2008/0062148 A1 | 3/2008 | Hotelling et al. | |
| 2008/0111714 A1 * | 5/2008 | Kremin ........................ | 341/33 |
| 2008/0122458 A1 * | 5/2008 | Lenz ............................ | 324/687 |
| 2008/0158175 A1 * | 7/2008 | Hotelling et al. ............ | 345/173 |
| 2009/0033343 A1 | 2/2009 | Reynolds et al. | |
| 2009/0206845 A1 | 8/2009 | Mackey | |
| 2009/0206852 A1 * | 8/2009 | Reynolds ..................... | 324/688 |
| 2009/0219257 A1 * | 9/2009 | Frey et al. .................... | 345/173 |
| 2009/0219258 A1 * | 9/2009 | Geaghan et al. ............. | 345/173 |
| 2010/0308847 A1 * | 12/2010 | Reynolds ..................... | 324/688 |
| 2012/0038581 A1 * | 2/2012 | Hotelling et al. ............ | 345/173 |
| 2012/0043973 A1 * | 2/2012 | Kremin ........................ | 324/658 |

\* cited by examiner

*Primary Examiner* — Prabodh M Dharia
(74) *Attorney, Agent, or Firm* — Morriss O'Bryant Compagni, PC

(57) ABSTRACT

A conductive shield that is disposed near the sensor, wherein a signal is driven on the shield that is similar to the signal induced on the sensor, thereby reducing stray capacitances and protecting the sensor from external noise sources, and resulting in a stronger signal reaching the sensor.

7 Claims, 3 Drawing Sheets

DRIVEN SHIELD FOR CAPACITIVE TOUCHPADS

CROSS REFERENCE TO RELATED APPLICATIONS

This document claims priority to and incorporates by reference all of the subject matter included in the non-provisional patent application having Ser. No. 12/059,810, filed on Mar. 31, 2008, now U.S. Pat. No. 8,243,043, which claims priority to provisional patent application having Ser. No. 60/908,853 and filed on Mar. 29, 2007.

BACKGROUND OF THE INVENTION

1. Field of the Invention

This invention relates generally to capacitance sensitive touchpads. Specifically, the invention relates to shielding that can be disposed near the electrodes of the sensor to protect the electrodes from unwanted noise or stray capacitances, thereby increasing the signal to noise ratio and improving performance of the capacitive touchpad.

2. Description of Related Art

To understand the capacitive touchpad technology used in the present invention, it is useful to examine one embodiment of touchpad technology that does not use but can be adapted to use the present invention. Specifically, the touchpad technology of CIRQUE® Corporation used for touch and proximity sensing will now be explained.

The CIRQUE® Corporation touchpad is a mutual capacitance-sensing device and an example is illustrated as a block diagram in FIG. 1. In this touchpad 10, a grid of X (12) and Y (14) electrodes and a sense electrode 16 is used to define the touch-sensitive (and proximity sensitive) area 18 of the touchpad. Typically, the touchpad 10 is a rectangular grid of approximately 16 by 12 row and column electrodes, or 8 by 6 electrodes when there are space constraints. Interlaced with these X (12) and Y (14) (row and column) electrodes is a single sense electrode 16. All position measurements are made through the sense electrode 16.

The CIRQUE® Corporation touchpad 10 measures an imbalance in electrical charge on the sense line 16. When no pointing object is on or in proximity to the touchpad 10, the touchpad circuitry 20 is in a balanced state, and there is no charge imbalance on the sense line 16. When a pointing object creates imbalance because of capacitive coupling when the object approaches or touches a touch surface (the sensing area 18 of the touchpad 10), a change in capacitance occurs on the electrodes 12, 14. What is measured is the change in capacitance, but not the absolute capacitance value on the electrodes 12, 14. The touchpad 10 determines the change in capacitance by measuring the amount of charge that must be injected onto the sense line 16 to reestablish or regain balance of charge on the sense line.

The system above is utilized to determine the position of a finger on or in proximity to a touchpad 10 as follows. This example describes row electrodes 12, and is repeated in the same manner for the column electrodes 14. The values obtained from the row and column electrode measurements determine an intersection which is the centroid of the pointing object on or in proximity to the touchpad 10.

In the first step, a first set of row electrodes 12 are driven with a first signal from P, N generator 22, and a different but adjacent second set of row electrodes are driven with a second signal from the P, N generator. The touchpad circuitry 20 obtains a value from the sense line 16 using a mutual capacitance measuring device 26 that indicates which row electrode is closest to the pointing object. However, the touchpad circuitry 20 under the control of a microcontroller 28 cannot yet determine on which side of the row electrode the pointing object is located, nor can the touchpad circuitry 20 determine just how far the pointing object is located away from the electrode. Thus, the system shifts by one electrode the group of electrodes 12 to be driven. In other words, the electrode on one side of the group is added, while the electrode on the opposite side of the group is no longer driven. The new group is then driven by the P, N generator 22 and a second measurement of the sense line 16 is taken.

From these two measurements, it is possible to determine on which side of the row electrode the pointing object is located, and how far away. Pointing object position determination is then performed by using an equation that compares the magnitude of the two signals measured.

The sensitivity or resolution of the CIRQUE® Corporation touchpad is much higher than the 16 by 12 grid of row and column electrodes implies. The resolution is typically on the order of 960 counts per inch, or greater. The exact resolution is determined by the sensitivity of the components, the spacing between the electrodes 12, 14 on the same rows and columns, and other factors that are not material to the present invention.

The process above is repeated for the Y or column electrodes 14 using a P, N generator 24

Although the CIRQUE® Corporation touchpad described above uses a grid of X and Y electrodes 12, 14 and a separate and single sense electrode 16, the function of the sense electrode can actually be performed by the X or Y electrodes 12, 14 by using multiplexing. Thus, when the X electrodes 12 are being driven with a signal, the Y electrodes 14 can function as sense electrodes. Likewise, the Y electrodes can be driven and the X electrodes then function as the sense electrodes. A touchpad design with or without a dedicated sense electrode can be used.

BRIEF SUMMARY OF THE INVENTION

In a preferred embodiment, the present invention is a conductive shield that is disposed near the sensor, wherein a signal is driven on the shield that is similar to the signal induced on the sensor, thereby reducing stray capacitances and protecting the sensor from external noise sources, and resulting in a stronger signal reaching the sensor.

In a first aspect of the invention, a driven shield electrode is disposed adjacent to a sense electrode to at least partially shield the sense electrode from stray capacitances.

In a second aspect of the invention, the driven shield electrode is disposed adjacent to the sense electrode to at least partially shield the sense electrode from electric noise.

In a third aspect of the invention, a driven shield substrate is disposed adjacent to a sense electrode to at least partially shield the sense electrode from stray capacitances.

In a fourth aspect of the invention, the driven shield substrate is disposed adjacent to the sense electrode to at least partially shield the sense electrode from electric noise.

In a fifth aspect of the invention, a driven shield electrode and a driven shield substrate are provided to at least partially shield the sense electrode from stray capacitances.

In a sixth aspect of the invention, a driven shield electrode and a driven shield substrate are provided to at least partially shield the sense electrode from electric noise.

These and other objects, features, advantages and alternative aspects of the present invention will become apparent to

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Figure 2:
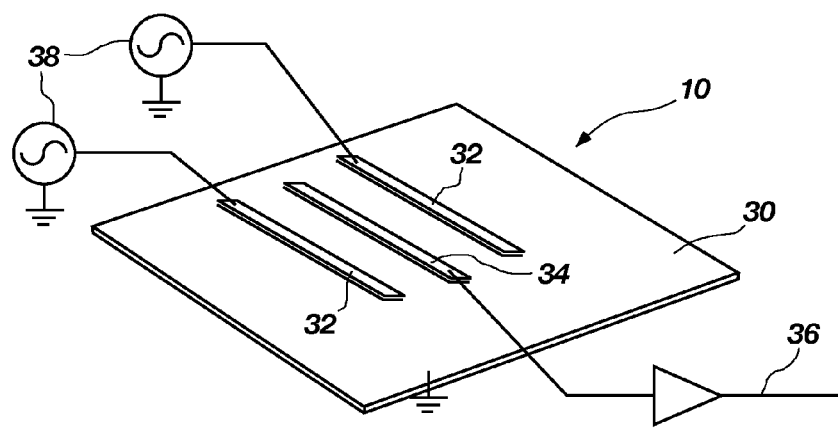
FIG. 2 is a perspective view of a portion of a capacitive touchpad sensor as found in the prior art.

FIG. 2 is a perspective view of a portion of a capacitive touchpad sensor including a grounded and conductive substrate 30, a plurality of drive electrodes 32, a sense electrode 34, a signal that is coupled to the sense electrode and then buffered 36, and a means 38 for generating a signal that is emitted from the plurality of drive electrodes 32. The buffered signal 36 is sent to a measurement circuit of a capacitive touchpad that is not relevant to the present invention. The present invention pertains to a system and method for obtaining a signal on the sense electrode 34 that is protected from both stray capacitances and electrical noise.

Figure 1:
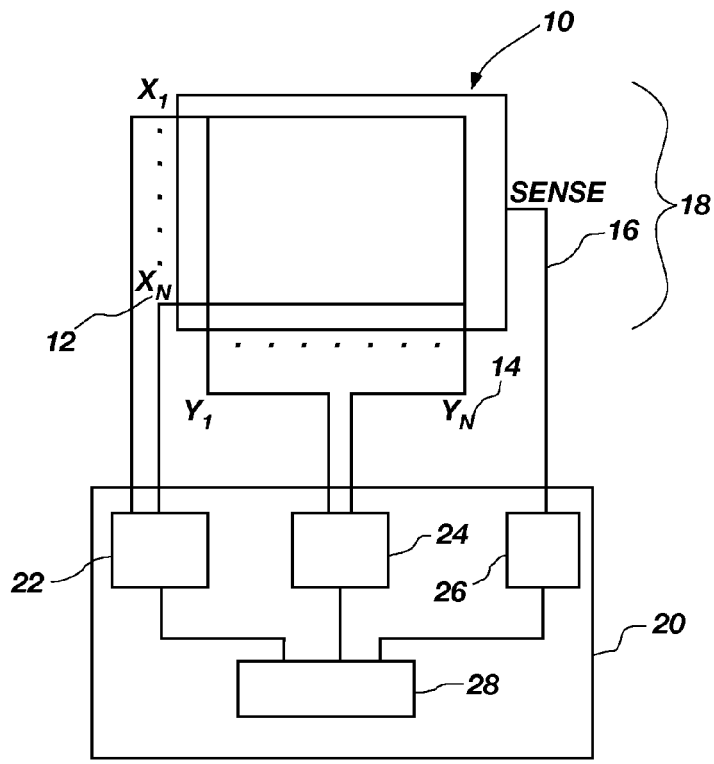
FIG. 1 is a block diagram of a touchpad as taught be the prior art, and which is adapted to function with the present invention.

In a portion of a capacitive touchpad 10 as shown in FIG. 1, a plurality of drive electrodes 32 emit electrical signals that are measured by the sense electrode 34. The introduction of a pointing object (not shown) near the drive electrodes 32 and the sense electrode 34, such as a human finger, has the effect of changing the voltage or charge that is coupled on the sense electrode. To measure the presence or the location of the pointing object on or near to a sensing area as defined by the plurality of drive electrodes 32 and the sense electrode 34, it is desirable that the pointing object have the maximum effect on the voltage or charge that is coupled on the sense electrode 34 by the signal from the plurality of drive electrodes 32.

The capacitive changes that are measured on the sense electrode 34 are very small. Unfortunately, the coupling between the plurality of drive electrodes 32 and the sense electrode 34 is susceptible to many influences that affect the accuracy of the capacitive changes being measured. These influences include variations in manufacturing processes, environmental changes and electrical noise. The present invention is a system and method for improving the accuracy of the capacitive changes being measured.

Decreasing stray capacitance from the sense electrode 34 to all other conductors will increase the accuracy of the capacitive changes being measured by the touchpad 10. Furthermore, shielding the sense line 34 from electrical noise sources will also increase the signal-to-noise ratio.

The present invention provides a driven shield that at least partially surrounds the sense electrode 34. The shield is driven with a signal that is similar to the signal that is coupled to the sense electrode 34.

Figure 3:
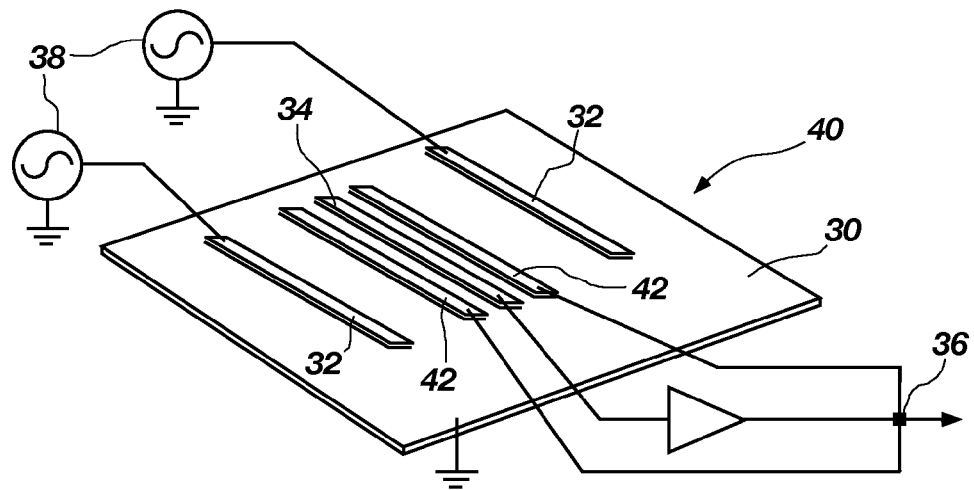
FIG. 3 is a perspective view of a portion of the capacitive touchpad sensor, but now including a driven shield electrode.

FIG. 3 illustrates the present invention and comprises a perspective view of a portion of a capacitive touchpad sensor 40 including a grounded conductive substrate 30, a plurality of drive electrodes 32, a sense electrode 34, a signal that is coupled to the sense electrode and then buffered 36, and a means 38 for generating a signal that is emitted from the plurality of drive electrodes 32. In addition to these components, a driven shield electrode 42 is disposed between the plurality of drive electrodes 32 and the sense electrode 34. The driven shield electrodes 42 receive the buffered signal 36 from the sense electrode 34.

Stray capacitances can be generated by the drive electrodes 32 when they are not actively being driven. The effect of the driven shield electrode 42 is to reduce the stray capacitances from the drive electrodes 32 or any other conductors that can generate stray capacitances. This effect in turn will enable a stronger signal at the sense electrode 34.

The same shielding effect created by the driven shield electrode 42 around the sense electrode 34 also protects the sense electrode from unwanted electrical noise either internal or external to the touchpad 10.

Figure 4:
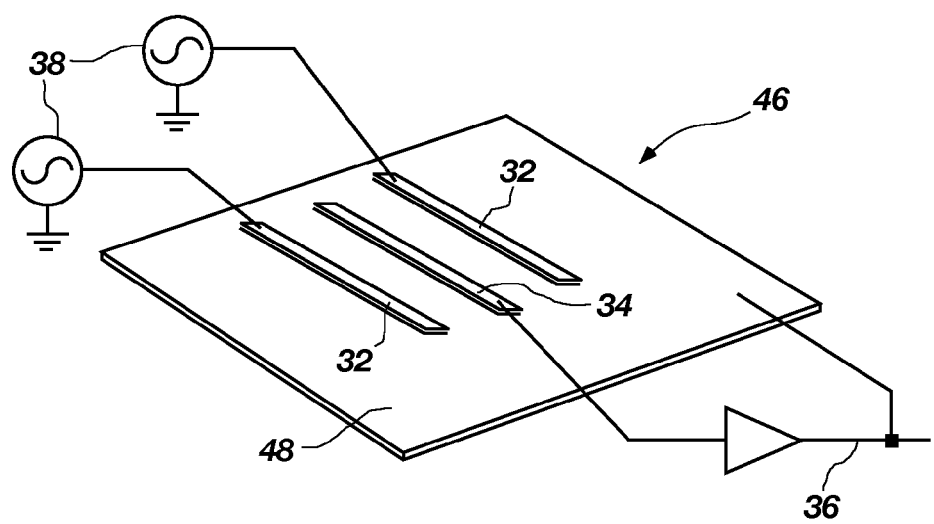
FIG. 4 is a perspective view of a portion of the capacitive touchpad sensor, but now including a driven shield substrate.

FIG. 4 is provided as an alternative embodiment of the present invention. The touchpad 40 comprises a perspective view of a portion of a capacitive touchpad sensor 46 including a plurality of drive electrodes 32, a sense electrode 34, a signal that is coupled to the sense electrode and then buffered 36, and a means 38 for generating a signal that is emitted from the plurality of drive electrodes 32. The system further comprises a driven shield substrate 48 upon which the drive electrodes 32 and the sense electrode 34 are disposed. The driven shield substrate 48 receives the buffered signal 36 from the sense electrode 34.

Figure 5:
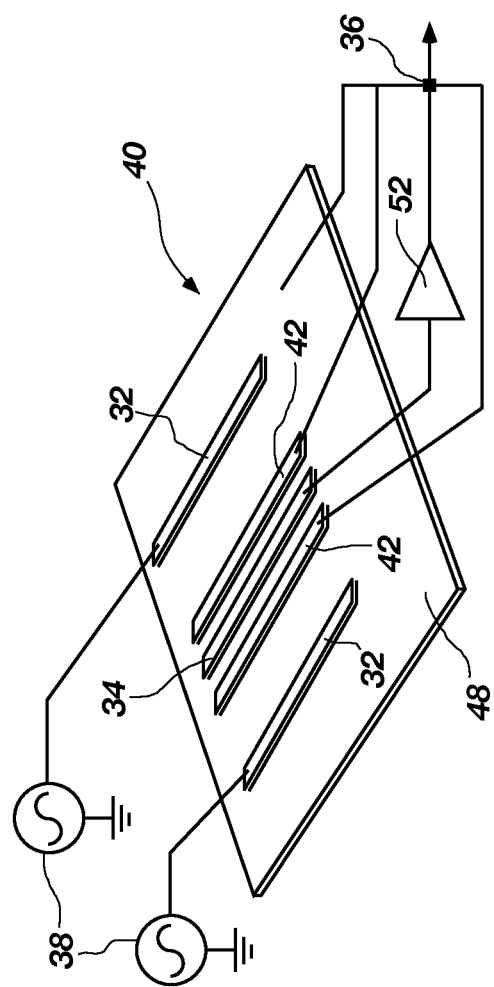
FIG. 5 is a perspective view of a portion of the capacitive touchpad sensor, but now including a driven shield electrode and a driven shield substrate

FIG. 5 illustrates another alternative embodiment of the present invention, and comprises a perspective view of a portion of the capacitive touchpad sensor 40 including a plurality of drive electrodes 32, a sense electrode 34, a signal that is coupled to the sense electrode and then buffered 36, and a means 38 for generating a signal that is emitted from the plurality of drive electrodes 32. In addition to these components, a driven shield electrode 42 is disposed between the plurality of drive electrodes 32 and the sense electrode 34, and a driven shield substrate 48 is provided as a means for arranging the drive electrodes 32, the sense electrode 34 and the driven shield electrodes 42. The driven shield electrodes 42 and the driven shield substrate 48 receive the buffered signal 36 from the sense electrode 34.

It is generally the case that the buffered signal 36 that comes from the sense electrode 34 is going to closely follow the signal that is coupled to the sense electrode from the drive electrodes 32. However, it should be understood that the signal from the sense electrode can be buffered or amplified. What is important is that the signal be modified so as to enhance protection of the sense electrode 34 as the signal from the drive electrodes 32 is coupled to it. The buffer, amplifier or signal modifier is shown in FIG. 5 as item 52.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method for shielding a portion of a capacitive sensor used in a touchpad, said method comprising:
   1) providing a plurality of drive electrodes for generating a signal and a plurality of sense electrodes, each one of the plurality of sense electrodes disposed between each of the plurality of drive electrodes for measuring a portion of the signal that is coupled to each of the plurality of sense electrodes;
   2) providing a plurality of driven shield electrodes in sets of two, wherein one driven shield electrode is disposed immediately adjacent to and on each side of each of the plurality of sense electrodes to thereby separate the plurality of sense electrodes from the plurality of drive electrodes, each set of the plurality of driven shield electrodes being electrically coupled to the sense electrode between them for receiving a modified signal from the sense electrode between them, the two immediately adjacent driven shield electrodes at least partially shielding the sense electrode between them from undesired electrical and capacitive signals, including stray capacitive signals from the plurality of drive electrodes; and
   3) providing a buffer between each of the sense electrodes and the two immediately adjacent driven shield electrodes to generate the modified signal and to thereby increase a signal to noise ratio on each of the sense electrodes by reinforcing the signal on each of the sense electrodes.

2. The method as defined in claim 1 wherein the method further comprises providing an amplifier between each of the sense electrodes and the two immediately adjacent driven shield electrodes to generate the modified signal and to thereby increase a signal to noise ratio on each of the sense electrodes.

3. The method as defined in claim 1 wherein the method further comprises:
   1) providing a driven shield substrate, wherein the at least one of the plurality of drive electrodes and at least one of the plurality of sense electrodes are attached to the driven shield substrate; and
   2) electrically coupling the driven shield substrate to the at least one of the plurality of sense electrodes to thereby receive the modified signal from the at least one of the plurality of sense electrodes, and wherein the driven shield substrate is positioned so as to at least partially shield the at least one of the plurality of sense electrodes from undesired electrical and capacitive signals.

4. The method as defined in claim 3 wherein the method further comprises providing a buffer between the at least one of the plurality of sense electrodes and the driven shield substrate to generate the modified signal and to thereby increase a signal to noise ratio on the at least one of the plurality of sense electrodes.

5. The method as defined in claim 3 wherein the method further comprises providing an amplifier between the at least one of the plurality of sense electrodes and the driven shield substrate to generate the modified signal and to thereby increase a signal to noise ratio on the at least one of the plurality of sense electrodes.

6. The method as defined in claim 4 wherein the method further comprises reducing stray capacitance between the at least one of the plurality of drive electrodes and the at least one of the plurality of sense electrodes to thereby increase the strength of the portion of the signal that is coupled to the at least one of the plurality of sense electrodes.

7. The method as defined in claim 6 wherein the method further comprises shielding the at least one of the plurality of sense electrodes from electrical noise to thereby increase the strength of the portion of the signal that is coupled to the at least one of the plurality of sense electrodes.

* * * * *